United States Patent
Pelrine et al.

(10) Patent No.: US 6,361,268 B1
(45) Date of Patent: Mar. 26, 2002

(54) FRICTIONLESS TRANSPORT APPARATUS AND METHOD

(75) Inventors: Ronald E. Pelrine, Boulder, CO (US); Jonathan R. Heim, Pacifica, CA (US)

(73) Assignee: SRI International, Menlo Park, CA (US)

(*) Notice: Subject to any disclaimer, the term of this patent is extended or adjusted under 35 U.S.C. 154(b) by 0 days.

(21) Appl. No.: 09/598,825

(22) Filed: Jun. 21, 2000

Related U.S. Application Data

(60) Provisional application No. 60/140,316, filed on Jun. 21, 1999, and provisional application No. 60/201,967, filed on May 5, 2000.

(51) Int. Cl.[7] .................. B65G 1/133; B60L 13/06; B60L 13/00
(52) U.S. Cl. ............... 414/749.2; 104/284; 104/286
(58) Field of Search .................. 414/749.2; 104/281, 104/284, 286; 198/619, 805

(56) References Cited

U.S. PATENT DOCUMENTS

| | | | |
|---|---|---|---|
| 3,589,300 A | 6/1971 | Wipf | |
| 3,597,022 A | 8/1971 | Waldron | |
| 3,664,268 A | * 5/1972 | Lucas et al. | 104/148 SS |
| 3,892,185 A | * 7/1975 | Guderjahn | 104/148 LM |
| 3,903,809 A | * 9/1975 | Mierickle et al. | 104/188 SS |
| 4,307,668 A | * 12/1981 | Vinson | 104/281 |
| 4,711,182 A | * 12/1987 | Alexandrov et al. | 104/283 |
| 4,805,761 A | 2/1989 | Totsch | |
| 4,979,445 A | * 12/1990 | Lanzara | 104/281 |
| 5,015,906 A | 5/1991 | Cho et al. | |
| 5,099,216 A | 3/1992 | Pelrine | |
| 5,177,387 A | 1/1993 | McMichael et al. | |
| 5,187,399 A | 2/1993 | Carr et al. | |
| 5,220,232 A | 6/1993 | Rigney, II et al. | |
| 5,287,026 A | * 2/1994 | Ogihara et al. | 310/12 |
| 5,298,875 A | 3/1994 | Laibowitz et al. | |
| 5,319,336 A | 6/1994 | Alcon | |
| 5,375,531 A | * 12/1994 | Ogihara et al. | 104/281 |
| 5,396,136 A | 3/1995 | Pelrine | |
| 5,666,883 A | * 9/1997 | Kuznetsov | 104/281 |
| 6,075,924 A | 6/2000 | Will | |

OTHER PUBLICATIONS

Berry, M.V. and Geim, A.K., "Of flying frogs and levitrons" *Eur. J. Phys.* 18:307–313 (1997).
Geim, A., "Everyone's Magnetism" *Physics Today* 51(9):36–39(1998).
Geim, A., et al., "Magnet levitation at your fingertips" *Nature* 400:323–324 (1999).
Gibbs, P. and Geim, A., "Is Magnetic Levitation Possible?" http://www–hfml.sci.kun.nl/hfml/levitation–possible.html (1997).
Ponizovskii, V.M., "Diagmagnetic suspension and its applications" *Instruments and Experimental Techniques* 24(4):833–841 (1982).
Post, R.F., "Maglev: A New Approach" *Scientific American* Jan.:82–87 (2000).
Simon, M.D., et al., "Spin stabilized magnetic revitation" *American Journal of Physics* 65(4):286–292 (1997).

\* cited by examiner

Primary Examiner—Christopher P. Ellis
Assistant Examiner—Kenneth W Bower
(74) *Attorney, Agent, or Firm*—Perkins Coie LLP

(57) ABSTRACT

A frictionless transport apparatus for transporting an object from a first to a second station is disclosed. The apparatus has a frame extending between the first and second stations and a carriage mounted for movement along said frame, in a levitated condition. A substantial portion of the weight of the carriage and load is supported by biasing magnets on the frame and carriage. The carriage and load are stabilized in a levitated condition by magnetic interactions between a diamagnetic plate on the carriage and a magnetic array extending along the frame. The carriage is moved in its levitated condition by a frictionless drive system, such as an electromagnetic, electrostatic, or pneumatic drive system. Also disclosed is a method of frictionless transport of an object between first and second stations.

16 Claims, 5 Drawing Sheets

FRICTIONLESS TRANSPORT APPARATUS AND METHOD

This application claims the benefit of U.S. Provisional Application No. 60/140,316, filed Jun. 21, 1999 and of U.S. Provisional Application No. 60/201,967, filed May 5, 2000, both incorporated herein by reference in their entirety.

FIELD OF THE INVENTION

The present invention relates to frictionless transport of a load, and a method and apparatus for achieving such transport.

BACKGROUND OF THE INVENTION

Frictionless transport of objects is a desirable goal in a number of commercial settings. In particular, in a clean-room setting where manufactured objects such as magnetic discs and wafers are being moved from one processing station to another, it is desirable to minimize generating dust or other particles during the any part of the clean-room operation. One source of such particles is from frictional contact between elements in a conventional transport device.

Frictionless movement of an object may also be desirable in machines of other mechanical devices where rapid and repeated mechanical movements can cause mechanical failure in one or more parts of the apparatus.

SUMMARY OF THE INVENTION

The invention includes, in one aspect, a frictionless transport apparatus for transporting an object of load from a first to a second station or position. The apparatus includes a frame extending between the first and second stations and a carriage mounted for movement along said frame, in a levitated condition, while carrying a load between the first and second stations. The carriage and object are suspended or partially suspended by frame and carriage biasing magnets mounted on the frame and carriage, respectively. The carriage is stabilized in its suspended condition by a stabilizing structure that includes a magnetic array extending between the first and second stations on the frame, and a diamagnetic plate mounted on said carriage, with at least a portion of the plate confronting and being disposed proximate to at least a portion of the array, as the carriage moves along said track. Magnetic interaction between said diamagnetic plate and the magnetic array acts to resist movement of the plate toward the array. The carriage in its levitated condition is moved along the frame by a frictionless drive system, such as a linear electromagnetic or electrostatic system or a pneumatic system.

The biasing magnet on the frame may be an electromagnet, where the strength of the magnetic field produced by the magnet can be varied to match carriage and load weight, or may be a permanent magnet, where load variation may be accommodated by diamagnetic interactions, or a adjusted distance between the biasing magnets.

The magnetic array may be, in various embodiments, (i) a planar array composed of magnets arranged side-by-side in alternating polarity, (ii) a planar array composed of magnets arranged side-by-side in alternating vertical and horizontal magnetic pole orientation, with the vertically-oriented magnets alternating in polarity and the horizontally-oriented magnets alternating in polarity, or (iii) an array formed of a plate of isotropic material that is magnetized with alternating poles.

In a preferred embodiment, the stabilizing structure includes at least two spaced-apart magnetic arrays, and the diamagnetic plate has opposite faces, at least portions of which confront and are proximate to at least a portion of the spaced apart magnetic arrays. Magnetic interaction between the diamagnetic plate and each planar array acts to maintain the plate between, and spaced from, the arrays. The spaced-apart arrays may be formed, for example, by a plurality of spaced-apart arrays supported by and projecting from a base member. The magnetic arrays and diamagnetic plate disposed between the arrays may be planar and substantially horizontally disposed, or planar and substantially vertically disposed.

The diamagnetic plate may be composed of graphite, e.g., pyrolytic graphite, or bismuth. The device may further include a conductive plate carried on the carriage, for moving therewith proximate to and adjacent the magnetic array, as the carriage moves along said frame, to damp eddy currents formed by carriage movement along the frame.

In one embodiment, the carriage's biasing magnet includes a linear array of magnets separated from each other by a known spacing distance, and the drive system includes a conductive-wire path and an alternating current source connected to the wire path for producing a linear magnetic drive force on the linear array of biasing magnets. In another embodiment, the drive system operates by electrostatic attraction between electrostatic elements on the frame and carriage, as the carriage moves along the frame. In yet another embodiment, the drive system operates by applying a compressed gas stream to the carriage from the frame, as the carriage moves along the frame.

In another aspect, the invention includes a method of frictionless transport of a load between first and second stations. The method includes the steps of placing the load on a carriage, supporting a substantial portion of the weight of the carriage and load with biasing magnets carried on a frame extending between the first and second stations and on the carriage, stabilizing the position of the carriage in a levitated condition, as it moves along the frame, by magnetic forces produced between a diamagnetic plate on the carriage and a magnetic array extending between the first and second stations on the frame, and driving the carriage along the frame with a frictionless drive system.

In another aspect, the invention includes a levitated system in which the levitated object is levitated with a gap of up to 5-10 mm or more. The system includes a frame and supported object, e.g., carriage, having biasing magnets for supporting a significant part of the weight of the object, and stabilizing structure includes a magnetic array on the frame and a diamagnetic plate on the object, for stabilizing the object in its levitated condition. The system may serve, for example, as a frictionless bearing in a machine, or a novelty item with an easily observable levitation gap.

These and other objects and features of the invention will be more fully appreciated when the following detailed description of the invention is read in conjunction with the accompanying drawings.

BRIEF DESCRIPTION OF THE DRAWINGS

FIG. 6 FIG. 2 is a simplified view of the magnetic elements in another emobodiment the apparatus of the invention;

DETAILED DESCRIPTION OF THE INVENTION

I. Definitions

The terms below have the following meaning herein unless indicated otherwise.

"Linear transport" or "linear movement" means movement along a path, which may be a curved path, a straight-line path, or a path with bends or turns. If the path is in a horizontal plane, the transport or movement is effective to move an object from one x-y coordinate to another x-y. If the movement is in a vertical plane, the transport or movement is effective to move an object from one z coordinate to another. Linear transport is distinguished from circular or rotational movement that preserves the x-y-z- coordinates of an object, but alters its angular coordinates.

"Biasing magnets" are magnets, preferably ferromagnets, used is supporting all or a major portion of the weight of a carriage and attached load, 80% or more of the combined weight, when the carriage and load are in a levitated condition. The ferromagnets may be permanent magnets or electromagnets.

"Diamagnetic" material refers to a material having magnetic permeabilities lower than 1, generally only slightly less than 1, and which provide relatively low lift force.

A "magnetic array" refers to an array of magnets, typically permanent magnets, whose poles are arranged to provide closed loop magnetic flux paths for each two consecutive magnets having oppositely directed poles. The consecutive magnets may be arranged side-by-side, or spaced from one another by one or more magnets whose poles are directed along another axis.

An object, e.g., carriage or carriage plus load is "levitated" if it is suspended against the force of gravity without contact with any support structure.

Biasing magnets support a "substantial portion" or the weight of a carriage (loaded or unloaded) in the apparatus of the invention if (i), in combination with diamagnetic forces diamagnetic generated in the stabilization structure, the carriage is suspended in a stable, levitated condition, and (ii) the diamagnetic forces themselves are unable to support the more than a fraction, e.g., 20% or less, of the carriage weight in a levitated condition. The biasing magnetic may support the entire weight of the carriage (loaded or unloaded), in which case the stabilizing structure may exert a downward force on carriage in its levitated condition, or only a fraction of the weight, e.g., 80% or more, in which case the stabilizing structure will exert a upward, weight-supporting force on the carriage.

II. Transport Apparatus

Figure 1:
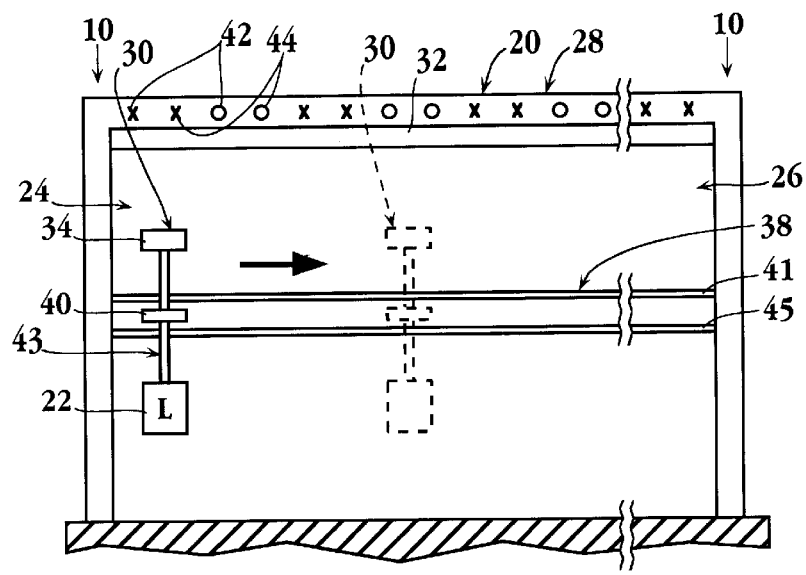
FIG. 1 shows basic elements of the transport apparatus of the invention.

FIG. 1 shows, in simplified schematic view, a frictionless linear transport apparatus 20 constructed in accordance with the invention. The apparatus is designed to transport a load 22 by linear transport or movement from one station 24 to another station 26. For example, in a clean-room setting, the two (or more) load stations may be different processing areas in the clean room.

The apparatus generally includes a frame 28 extending between the stations, and a carriage 30 mounted for linear movement along the frame in a levitated condition between the two stations. The carriage supports load 22 for movement between the two stations, when the carriage and load are in a levitated condition.

The weight of the carriage and load is supported against the force of gravity wholly or in large part by frame and carriage biasing magnets 32, 34, respectively, mounted on the frame and carriage, respectively. As will be discussed below, the stabilizing structure in the apparatus may provide some magnetic "lift" on the carriage and load, which may typically be 20% of the load or less, depending on the total area of magnetic interactions between the magnetic array(s) and the diamagnetic plate(s) in the apparatus.

The frame biasing magnet in this embodiment consists of an elongate permanent or electromagnet whose magnetic field strength is fixed along the length of the path. In either case, the biasing magnets are conventional and designed or activated to produce lift on the carriage and load sufficient for levitation, e.g., in the range 1 lb to 50 lbs. lift, depending on the weight of the carriage and load.

In the case of biasing electromagnets, the current supplied to the electromagnet is adjustable to achieve levitation of a desired carriage/load weight. This may be accomplished by a standard control device, such as pressure sensors positioned on the frame below the carriage to indicate when the carriage (and load, if any) have been suspended and no longer applying a force on the sensors.

Where the frame biasing magnet is a permanent magnet, variation in load on the carriage may be accommodated by the diamagnetic lift, which can be designed, as detailed below to provide stabilization over a wide range of weights, e.g., in a range between that at which the biasing magnets exert a pull that is 20% greater than the force of gravity acting on the carriage to one at which the magnetic pull is 20% less than the gravitational force acting on the carriage. Alternatively, or in addition, the vertical position of the frame biasing magnet may be adjusted relative to that of the carriage biasing magnet for different preselected loads.

The carriage-biasing magnet is preferably a permanent magnet whose poles are oriented for magnetic attraction by the frame magnet. The carriage magnet has a conventional construction, and is formed of a magnetic alloy,.e.g., a neodynium-iron-boron alloy, preferably having a grade 35 megagauss-oersteds or higher. In one embodiment, the carriage magnet consists of two or more magnets which are spaced from one another along the direction of carriage movement, and have the same pole orientation. The magnet spacing may be advantageous in an electromagnetic linear drive system as described below.

Stabilizing structure or means in the apparatus includes a magnetic array 38 mounted on the frame and extending along the length thereof, between stations 24, 26, and a diamagnetic plate 40 mounted on the carriage. The embodiment in FIG. 1 has two magnetic arrays, 38, 42, disposed on either side of the diamagnetic plate, providing stabilization in both downward and upward directions.

The diamagnetic plate is formed of a diamagnetic material such as graphite or bismuth, and preferably pyrolytic graphite, which has the lowest relative magnetic permeability or value closest to zero of the common diamagnetic materials. Pyrolytic graphite has an oriented structure crystal layers.

A variety of alternative array/plate configurations, several of which are considered below, are contemplated. The array and plate serve to stabilize the carriage and attached load (if present) in its levitated condition, and incidentally may provide a certain amount of lift to the carriage and load. More specifically, and as will be described below, magnetic interaction between the diamagnetic plate and magnetic array acts to resist movement of the plate toward the array.

A carriage support structure 41 connects the carriage biasing magnet and diamagnetic plate, and provides sufficient spacing between the two to minimize or eliminate magnetic coupling effects between the two. The lower end of the support structure is adapted to hold load 22.

Also included in the apparatus is a drive mechanism or means for moving the carriage, with such in a levitated condition, along the frame between two points along the frame, e.g., between stations 24, 26. The drive mechanism in the FIG. 1 embodiment includes a pair of conductive paths, seen end-on at 42 and 44, and shown in plan view in FIG. 10 below.

Figure 2:
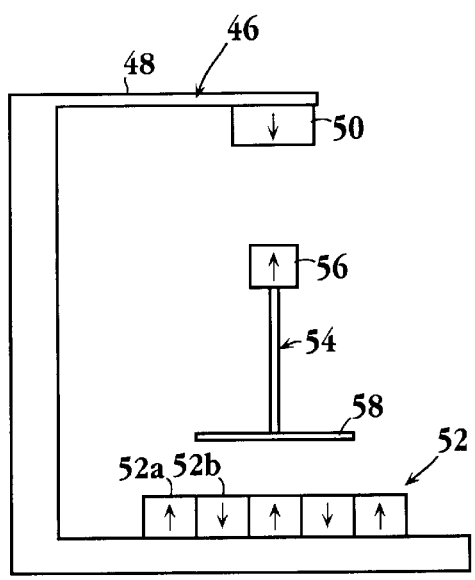
FIG. 2 is a simplified view of the magnetic elements in one embodiment of the apparatus of the invention.

FIG. 2 shows basic magnetic elements of an apparatus 46 illustrating one type of magnetic array pole configuration suitable in the invention. Briefly describing the elements shown, a frame 48 supports a frame biasing magnet 50 and a magnetic array 52. A carriage 54 has an upper biasing magnet 56 which interacts with magnet 50, and a lower diamagnetic plate 58 which interacts with array 52. The magnetic array consists of a plurality of side-by-side magnets, such as magnets 52*a*, 52*b*, whose magnetic poles, indicated by arrows, are in opposite directions. In an exemplary embodiment, each magnet is a permanent magnet of rectangular box shape and measures 5×10×25 mm, the 5 mm being the thickness dimension, and also the direction of magnetization or direction along which the magnetic poles are spaced. These dimensions provide a ratio of thickness divided by width that is 0.5 for each magnet. The planar dimensions of the array itself is such as to "cover" a substantial portion of the diamagnetic plate which confronts the array, as seen for example in FIG. 9, and to extend along the length of the frame in a longitudinal direction.

Figure 3:
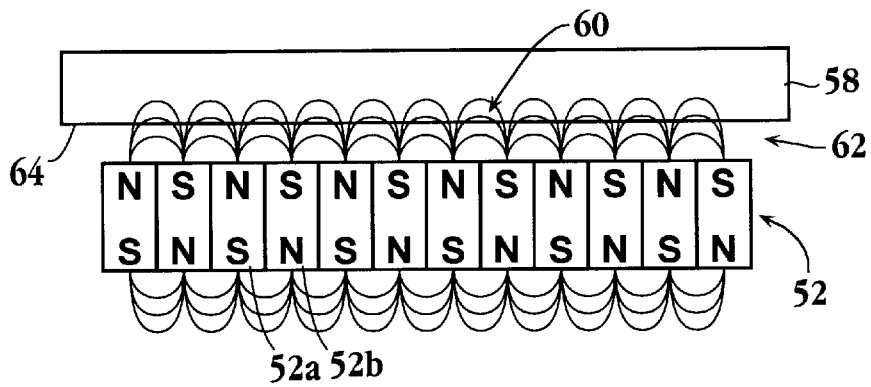
FIG. 3 illustrates the interaction between the magnetic array and diamagnetic plate in the FIG. 2 configuration.

In operation, and with reference to FIG. 3, the arrangement of magnets in array 52 produces a magnetic field 60 in the gap 62 between the array 52 and the confronting face 64 of diamagnetic plate 58. As seen, the magnetic field has both a high magnetic strength and a high gradient along the direction of magnetization. The diamagnetic plate interacts with this magnetic field to produce a lift force that opposes the force of gravity acting on the plate. The interaction acts to stabilize the carriage and load in a suspended condition by providing a magnetic "cushion" for the combined carriage and load, if the carriage experiences net downward forces due to gravity or vibrations. This allows the portion of the weight of the carriage and load supported by the biasing magnets to be less, e.g., up to 20% total weight or more, than their total weight and still achieve levitation, where the array is positioned below the plate. Similarly, where the array is positioned above the plate, the magnetic force exerted by the biasing magnets can be substantially greater than the gravitational force acting on the carriage, e.g., 20% greater, without loss of levitation stability or contact between the carriage and frame.

The magnetic strength of the field 60 changes rapidly as a function of distance from the array 52. For the specific dimensions noted above, gap 62 will be about 0.5 to 2 mm. Typically, depending on the strength of the array magnetic field and the material and thickness forming the diamagnetic plate, the magnetic interaction between the two provides a lift of about 3 g/inch$^2$ confronting area between a lower plate surface and magnetic array.

Similarly, an upper magnetic array (see FIG. 8 and the discussion below) acts to resist movement of the plate when the carriage experiences a net upward force, due to the biasing magnets or vertical oscillations during travel. As noted above, this allows magnetic force acting on the carriage and load by the biasing magnets to be somewhat different from the gravitational force in the opposite direction, without loss of stability of the levitated state or contact between the diamagnetic plate and upper array. Thus, the diamagnetic interaction supports the carriage (with or without load) in a suspended "equilibrium" condition in which all or much of the weight of the carriage and load is supported by the biasing magnets. If the carriage plate moves toward the array, the stronger magnetic interaction with the magnetic array opposes the motion, and acts to move the carriage back toward its equilibrium position. Similarly, if the carriage moves away from the array, the weaker magnetic force allows the carriage to return to its equilibrium position.

Figure 4:
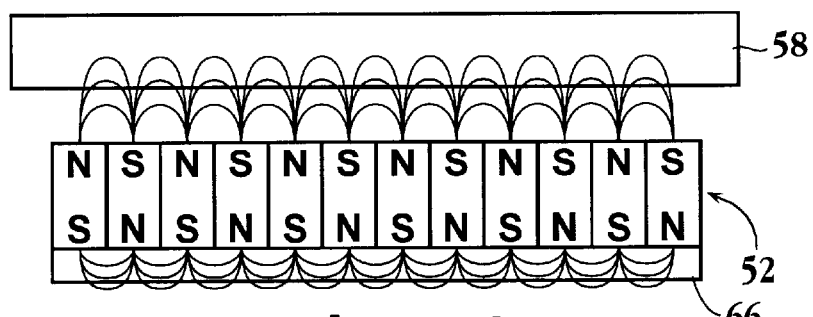
FIG. 4 illustrates the interaction between the magnetic array and diamagnetic plate in the FIG. 2 configuration, but where the magnetic array includes a layer of ferromagnetic material.

FIG. 4 shows the same magnetic array/plate configuration (with the same number designation), but further including a ferromagnetic plate 66 placed across the bottom of array 52. Ferromagnetic layer 66 provides a low resistance magnetic path below array that increases the flux density of field 60 in gap 62 between array 52 and the diamagnetic plate. This increased flux density provides a higher lift force that will levitate a greater mass of material.

Figure 5A:
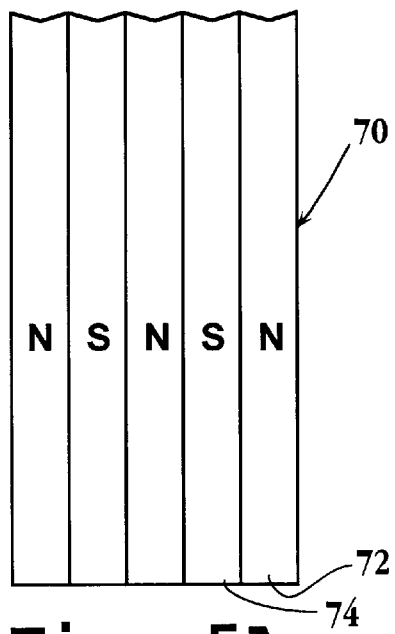
FIGS. 5A and 5B are plan views of alternative magnetic array configurations for the magnetic array shown in FIG. 2.
Figure 5B:
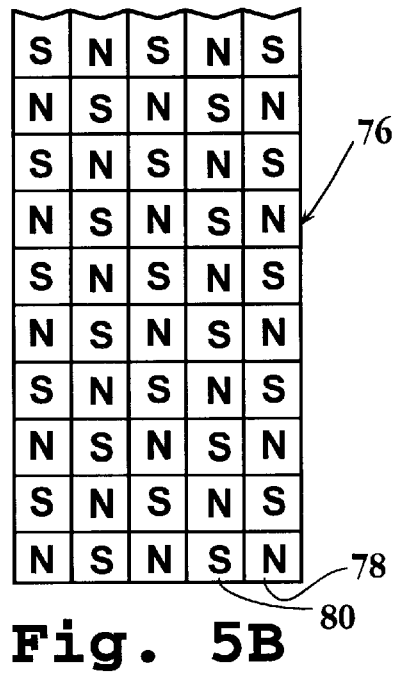

FIGS. 5A and 5B illustrate in plan view two alternative configurations of magnetic arrays in the array embodiment shown in FIG. 2. In the FIG. 5A array, indicated at 70, the magnetic elements forming the array are elongate magnetic strips, such as strips 72, 74, whose top surfaces (the surfaces facing the diamagnetic plate) are either up (N) or down (S) along the length of the strip. This array configuration produces a magnetic field like that shown head-on in FIG. 3, extending along the entire length of the array.

An alternative array is shown at 76 in FIG. 5A. This array is made up of a checkerboard of magnetic cubes whose top surfaces have the N or S polarity indicated. The array produces a magnetic field like that seen head-on in FIG. 3, but has the same field shape when viewed from the side, i.e., along the length of the array.

Figure 6:
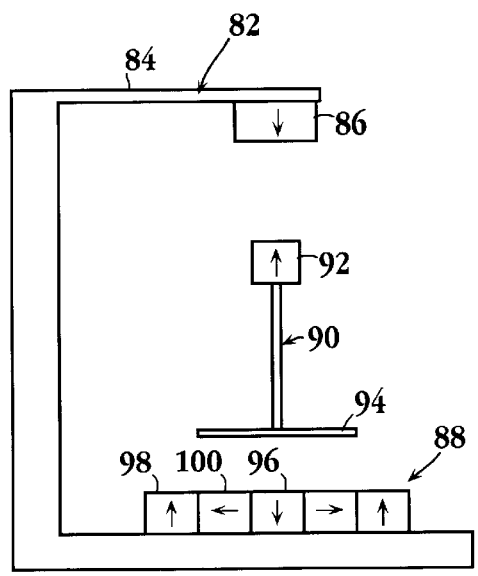

FIG. 6 shows basic magnetic elements of an apparatus 82 illustrating a second general type of magnetic array pole configuration suitable in the invention. Briefly describing the elements shown, a frame 84 supports a frame biasing magnet 86 and a magnetic array 88. A carriage 90 has an upper biasing magnet 92 which interacts with magnet 86, and a lower diamagnetic plate 94 which interacts with array 88 array.

Figure 7:
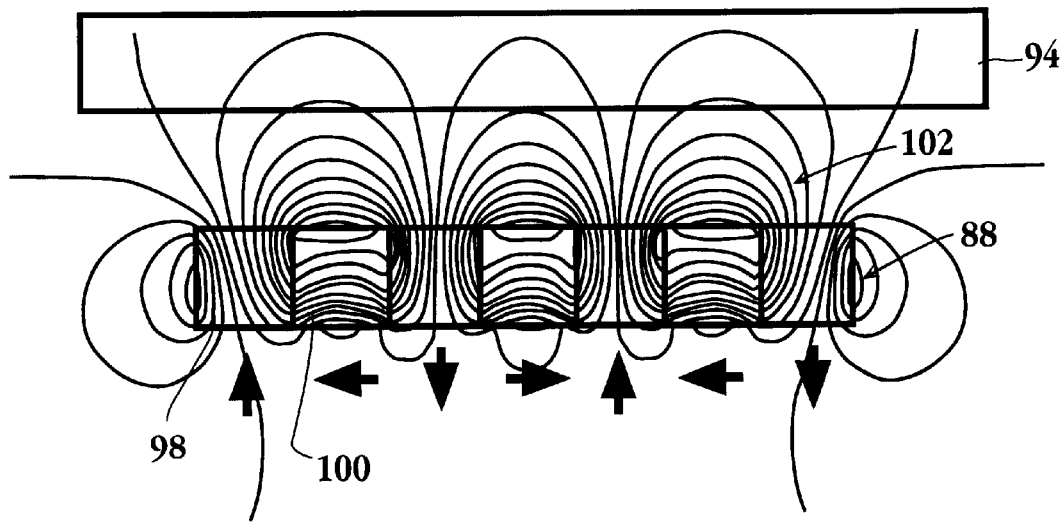
FIG. 7 illustrates the magnetic interaction between the magnetic array and diamagnetic plate in the FIG. 6 configuration.

As seen in head-on view, the permanent magnets with opposite "vertical" polarity, such as magnets 96, 98, are separated from one another by magnets, such as magnet 100, with opposite "lateral" polarity. The magnetic field produced by this array is seen head-on at 102 in FIG. 7, where the arrows beneath each magnet indicate the direction of magnetic polarity. Where the direction of magnetic flux between two vertical poles is in the direction of an intervening lateral-polarity magnet, the magnetic flux is largely confined to the array itself. Where the flux is in the opposite direction, the flux is largely above the array, as indicated. This configuration, then, shifts the magnetic field strength of the array largely to one array surface, namely, the surface facing the diamagnetic plate.

Figure 9:
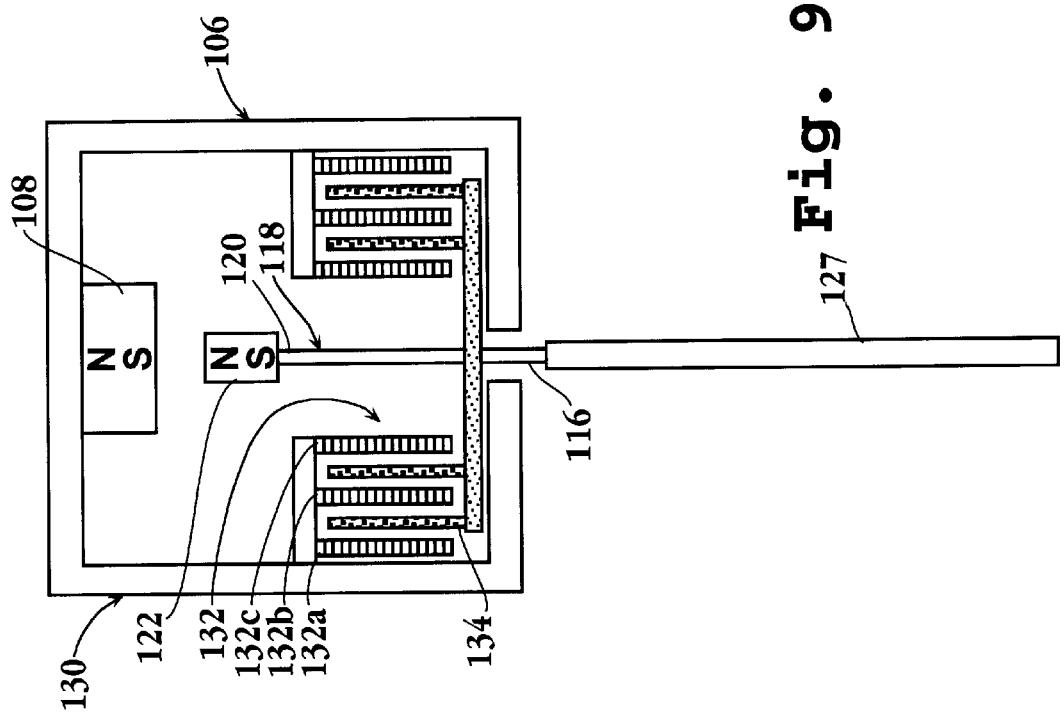
FIG. 9 is a simplified view of a cross-section of a second embodiment of the apparatus of FIG. 1.
Figure 8:
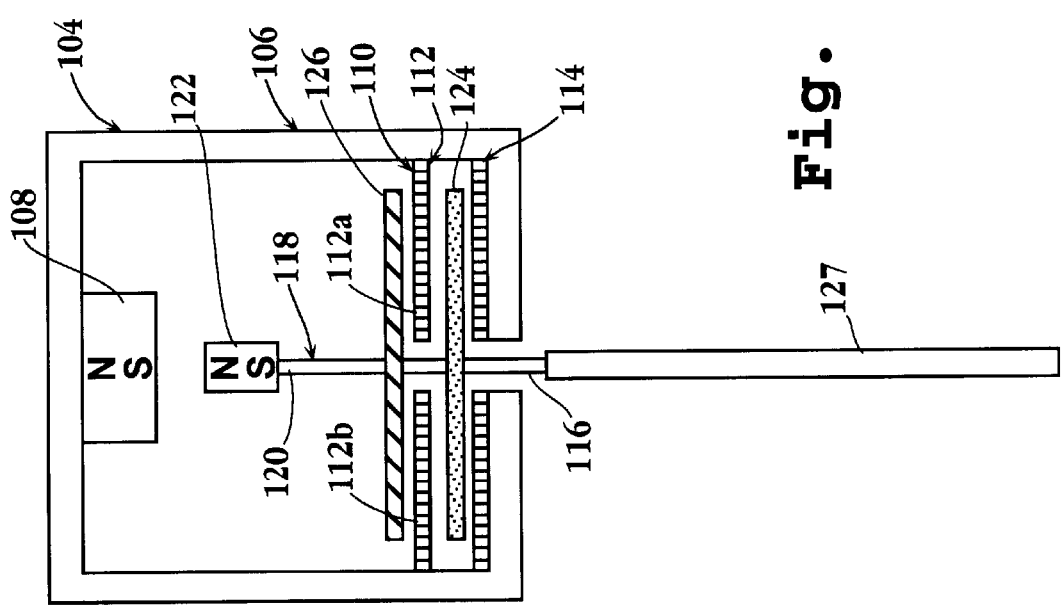
FIG. 8 is a simplified view of a cross-section of one embodiment of the apparatus of FIG. 1.

FIGS. 8 and 9 illustrate exemplary horizontal and vertical diamagnetic stabilization configurations in the invention, respectively. In FIG. 8, an apparatus 104 has frame 106 with biasing magnet 108 and a magnetic array structure 110 composed of two horizontally disposed arrays 112,114. Each array, in turn, is composed of two side-by-side sections, such as sections 112*a*, 114*b*, defining a slot 116 between the two sections. A carriage 118 in the apparatus includes a support 120 mounting a frame-biasing magnet 122, a diamagnetic plate 124, and a load arm 126 to which a load can be attached for movement with the carriage. As seen, the upper and lower faces of the diamagnetic plate confront overlapping regions of the array sections 112, 114, respectively.

In a typical apparatus designed to carry a combined carriage/load weight of between about up to 25–50 lbs. or more, where the diamagnetic stabilization is designed to support a small fraction, e.g., 5–20% of the weight of the loaded carriage, the spacing between the two magnetic arrays is about 3.5 mm, and the thickness of the diamagnetic plate is about 1.5 mm. The apparatus is designed to provide a total area of the confronting portions of a diamagnetic plate and associated underlying magnetic array of 322 square inches of effective graphite per 2.2 lbs. of weight support. It will be appreciated that the total area of the magnetic array/plate interaction, and thus the amount of weight that the stabilizing structure can support, can be increased by any desired factor by employing stacked arrays such as illustrated below in FIGS. 11 and 12.

Completing the description of the structure shown in FIG. 8, a conductive plate 126, such as one formed of aluminum, on the carriage just above the upper magnetic array acts to create eddy currents which resist the movement of the carriage with respect to the magnetic arrays, to further stabilize motion of the carriage with respect to the frame. For example, movement of the plate in the longitudinal direction over the array in 5A would produce little or no damping, whereas lateral movement with respect to the array would be damped. Thus both the conductive plate and configuration of magnetic array can be designed to further stabilize motion in desired directions. The plate has a preferred plate thickness of about 0.05–2 mm, and is positioned typically about 1–10 mm above the uppermost magnetic array.

As noted above, interaction of the diamagnetic plates with each array acts to bias the plate toward the center of the gap between the two arrays. Forces tending to push the carriage in a downward direction, e.g., gravitational or vertical oscillation forces, are resisted by magnetic interaction between the plate and the lower array. Forces tending to move the carriage in an upward direction, e.g., the magnetic force of the biasing magnets or vertical oscillation forces, are resisted by magnetic interactions between the plate and upper array. It will be appreciated, however, that the magnetic arrays may be designed, as in FIG. 7, to have a relatively large magnetic field strength above the plate, to resist the weight of the carriage, and relatively small magnetic filed strength below the array, in the direction that would resist plate movement in an upward direction. This configuration combines vertical stability with efficient weight support (weight support per weight of the diamagnetic plates).

The carriage is maintained in a horizontally centered travel position on the frame primarily by the force exerted by the biasing magnets which are arranged so that the highest magnetic field strength of frame magnet 108 is concentrated at the center of the frame, thus holding carriage magnet 122 at or close to the center of the frame. Edge effects between the magnetic arrays and diamagnetic plates may also contribute to horizontal stability. The edge effects can be enhanced by machining slots in the diamagnetic plates, i.e., slots that are dimensioned and spaced to correspond to the magnetic "bumps" produced by the magnetic arrays (the slots want to reside in the weakest portion of the coupled magnetic field, and thus for pyrolytic graphite, would line up with the centers of the poles in the array).

Further horizontal stability can be achieved with a stabilization configuration like that shown in FIG. 9, where the reference numerals are the same as those in FIG. 8 for like structure. Apparatus 130 in this figure includes a magnetic array structure 132 composed of three sets of vertically disposed magnetic arrays, such as arrays 132*a*, 132*b*, 132*c*, and a diamagnetic plate, such as plate 134, interposed between each set of magnetic arrays. The magnetic arrays mounted on frame 106 and the diamagnetic plates mounted on carriage 116 in this apparatus serve to maintain the carriage in a horizontally stabilized condition via magnetic interactions which act to hold the diamagnetic plates midway between the two adjacent and confronting magnetic arrays. Vertical stability can be achieved by forming slots in the plates parallel to the array magnets, as described above. This configuration would be useful, for example, in a transport device that executes, as part of the transport process, both linear and rotational movement of the carriage. Although not shown, this embodiment preferably also includes horizontal magnetic array/plate stabilization, such as illustrated in FIG. 8.

Figure 10:
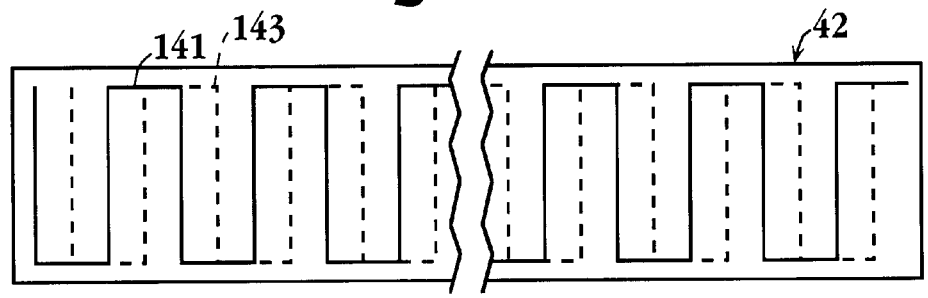
FIG. 10 is a plan view of the conductive wire pattern in the apparatus of FIG. 1, for driving the carriage in the apparatus by a linear motor mechanism, as seen along view plane 8—8 in FIG. 1.

As noted above, movement of the carriage in the apparatus from one station to another is carried out by a drive mechanism that is preferably friction-free, that is, does not involve any mechanical coupling between the carriage and the frame or other fixed structure. With reference to FIGS. 1 and 10, one preferred drive mechanism or means is a magnetic linear-motor mechanism that uses the carriage biasing magnet as the permanent magnet in the linear motor. The mechanism, which is illustrated in plan view at 42 in FIG. 10, involves two conductive wire paths 140 (solid lines) and 142 (dotted lines). Preferably, the spacing between "active" segments (vertical segment in FIG. 10) in each wire corresponds to the spacing between adjacent permanent magnets forming the carriage permanent magnet. Thus, when current is supplied to path 140, creating a magnetic field in the alternate gaps between the carriage biasing magnets, the carriage is advanced forward toward magnetic alignment with the current-produced magnetic field. The current is applied to the two traces 90 degrees out of phase, to alternately advance the carriage from trace to trace. Other means, such as multiple linear motor coils, can also be used.

In another embodiment, not shown, the drive mechanism or means is an electrostatic linear motor having charged elements on the carriage and activatable elements on the frame along the path of travel of the carriage.

In still another embodiment, the drive means is a pneumatic drive having a series of stationary air-ejection ports along the length of the frame and a plate or sail on the carriage for responding to the directed airflow so produced.

Figure 12:
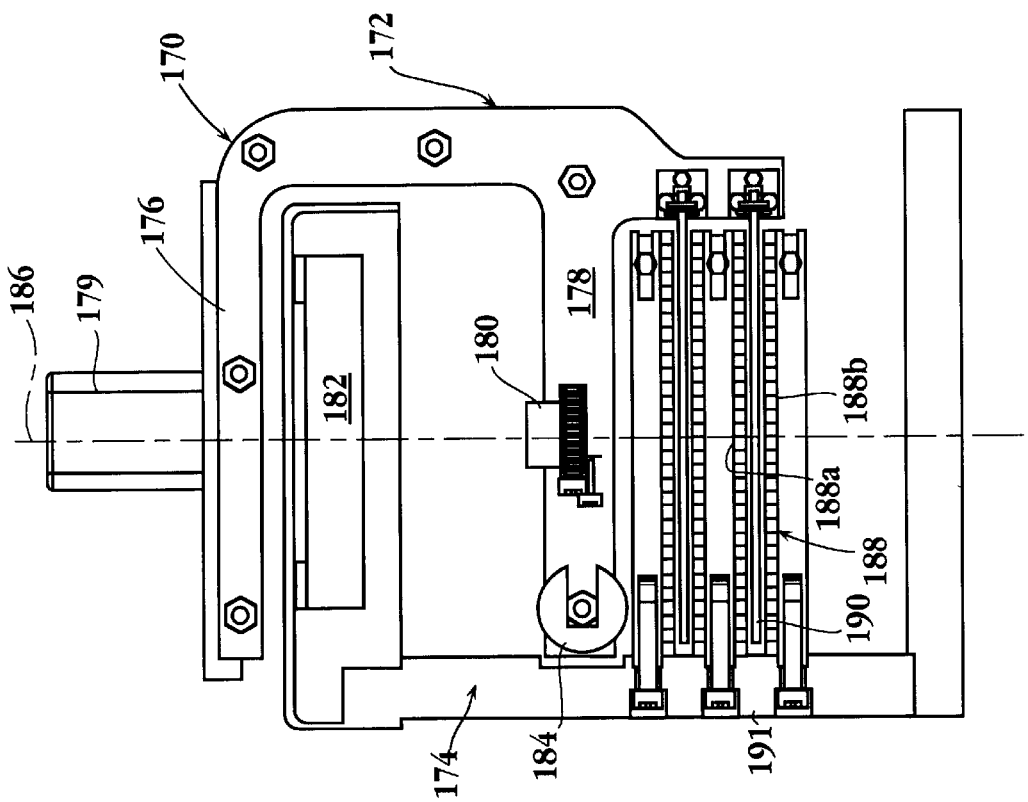
FIG. 12 is a detailed cross-sectional view of an asymmetrical transport apparatus incorporating the magnetic features illustrated in FIG. 8.
Figure 11:
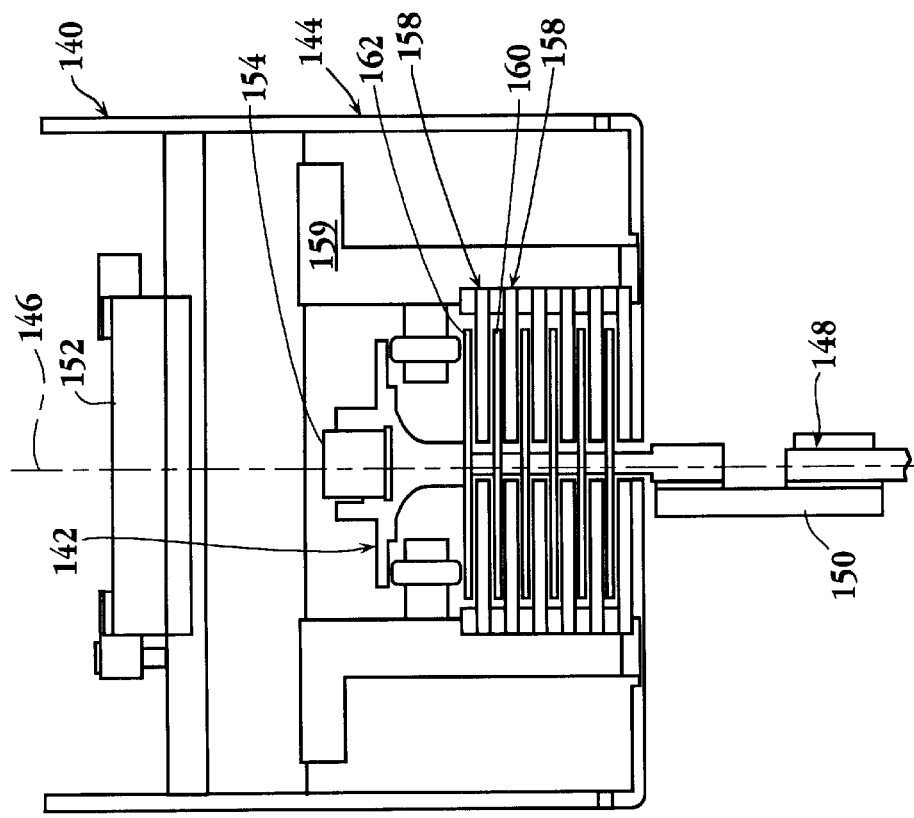
FIG. 11 is a detailed cross-sectional view of a symmetrical transport apparatus incorporating the magnetic features illustrated in FIG. 8.

FIGS. 11 and 12 show details of two exemplary types of transport apparatus constructed in accordance with the invention. In both illustrations, movement of the carriage in the apparatus is in a direction normal to the plane of the drawing.

In apparatus 140 in FIG. 11, a carriage 142 is symmetrically mounted on a frame 144, defining a magnetic centerline 146 representing the center of magnetic forces acting on the carriage. A load 148 is carried at 148 at the lower portion of the carriage. Since the center of gravity of the carriage and load must be along the magnetic centerline (to prevent the load form producing a net torque on either side of the carriage), the load itself may be balanced along the centerline, or alternatively, the carriage may be provided with a counterweight 150 to balance the load along the centerline.

The frame and carriage biasing magnets are shown at 152, 154, respectively. The stabilizing structure in the apparatus includes a plurality of horizontally disposed two-section magnetic arrays, such as arrays 156, carried on frame 144, and a plurality of diamagnetic plates, such as plate 160, disposed between an associated left and right pairs of adjacent magnetic array sections as shown. Each adjacent (vertically stacked) array section is mounted on a base member, such as base member 159, and extends in a direction normal therefrom. The apparatus shown has six arrays and five interleaved magnetic plates, effectively increasing the weight-supporting capability of each diamagnetic plate and associated magnetic arrays by a factor of five.

An aluminum plate 162 mounted on the carriage above the uppermost magnetic array serves to create eddy currents formed as the carriage advances over the magnetic array, serving to dampen motion as described above. The linear movement of the carriage between two or more different stations may be effected by an electromagnetic, electrostatic, pneumatic or other frictionless drive system.

Apparatus 170 in FIG. 12 has an asymmetrical frame-and-carriage configuration that allows carriage 172 in the apparatus to be removed from frame 174 at any point along the carriage travel, e.g., for servicing the carriage, replacing the carriage load, and/or replacing one carriage with another. The carriage is generally U-shaped, with the upper arm 176 providing an upper platform for carrying a load, and a lower arm 178 supporting a carriage biasing magnet 180 disposed below a frame biasing magnet 182. The lower arm also mounts a counterweight 184 which can be adjusted in a left/right direction in the figure to balance the weight of load 178 along the magnetic centerline the frame, indicated at 186. The counterweight may be an actual weight or a secondary magnetic force produced, for example, by a frame-mounted variable-strength electromagnetic that interacts with a permanent magnet carried on the carriage to provide a force that maintains the center of gravity of the loaded carriage along its magnetic centerline.

The stabilizing structure in the apparatus includes two magnet arrays, such as array 188, each having upper and lower array plates, such as plates 188a, 188b spaced for receiving a carriage-mounted diamagnetic plate, such as plate 190, therebetween. As in apparatus 140, the array plates or arrays are mounted on a base member 190. Linear movement of the carriage is by a frictionless drive system, as described above.

As can be appreciated from FIG. 12, carriage 172 can be removed from frame simply by moving the carriage (against the magnetic force exerted by the biasing magnets) to the right in the figure until the carriage is free of the frame, that is, the carriage diamagnetic plates are free of the magnetic arrays. To facilitate movement of a carriage in or out of operative position on the frame, the carriage may be provided with rollers that allow the carriage to be rolled onto and supported on a separate carriage.

In operation, the carriage is placed at a desired position along its travel path, e.g., at one of the stations where a load is transferred to the carriage. Depending on the configuration of the apparatus, and the weight and disposition of the load, it may be necessary to adjust the position or amount of a counterweight, as discussed above. With the weight of the loaded carriage supported wholly or partially by the biasing magnets, and stabilized by the diamagnetic interactions between the frame's magnetic array and carriage's diamagnetic plate, the carriage is moved, by a frictionless drive system, toward a second desired position along its travel path, e.g., in a second station. There the load may acted upon by further processing without removal from the carriage, or it may be removed, and the carriage returned to its original position, or the load may be removed for additional processing, and then reloaded on the carriage for movement toward another station, or the load may be replaced by a second load.

From the foregoing, it will be appreciated how various objects and features of the invention are met. The apparatus provides a frictionless transport system that is capable of lifting substantial load weights, e.g., 25–100 lbs., in a setting where is important to minimize frictional interactions, e.g., a clean-room setting. The levitation is stabilized by a diamagnetic track system that stabilizes the carriage in a levitated state along its path of travel, and accommodates significant variations in load weight without loss of stabilized load weight. Where the biasing magnets in the apparatus are both permanent magnets, the apparatus has the further advantage of maintaining a levitated condition even if power is lost. In addition, in the stabilized levitation structure of the invention allows one to achieve large levitation gaps, e.g., on the order of 5–10 mm, for purposes of isolating electrical a equipment, for novelty items, as described below, and for vibration isolation from the frame.

Figure 13:
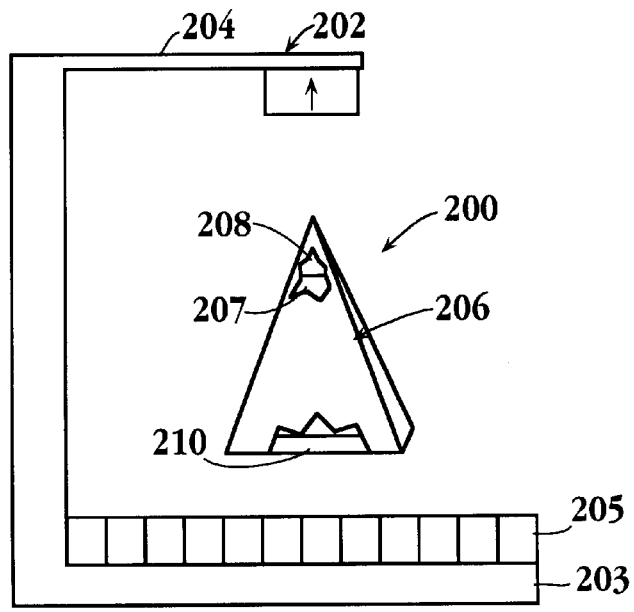
FIG. 13 illustrates a levitating pyramid toy incorporating based on the magnetic interaction features of the present invention.

Although the invention has been described with respect to particular embodiments, it will be apparent to those skilled in the art that various changes and modifications can be made without departing from the invention. For example, the combination of biasing magnets for weight support and diamagnetic interactions for stabilizing levitation can be applied to novelty and other devices, such as the novelty device shown at FIG. 13. This devices includes a frame 202 whose upper frame member 204 is a permanent magnet, and whose lower frame member 203 supports a magnetic array 205. The "carriage" in the device is a pyramid formed of a low-weight material, such as material 207 having embedded therein, a biasing magnet 208 and a lower diamagnetic plate 210. When the pyramid is placed in the frame, as shown, its weight is largely supported by the force of the biasing magnets, with the diamagnetic interactions serving to support a small portion of the weight and stabilized the pyramid in its levitated state. The object can be moved in its levitated state by directing an air current against a side of the pyramid or by briefly touching it to place it in motion. As a novelty item, the device allows the user to enjoy the effect of both an easily observable gap between the frame and levitated object, and observe the motion of the object in a levitated state.

Thus, the invention includes, in another aspect, a hybrid levitation system having the elements of the system above, but designed for stationary carriage levitation with a large gap.

It is claimed:

1. A frictionless transport apparatus for linear transport of an object from a first to a second station or position, comprising a frame extending between the first and second stations, a carriage mounted for linear movement along said frame in a levitated condition, while carrying an object between the first and second stations, frame and carriage biasing magnets mounted on said frame and carriage, respectively, for suspending a substantial portion of the weight of the carriage and the object supported thereon by magnetic attraction between the frame and carriage biasing magnets, diamagnetic stabilizing means for stabilizing the suspended condition of the carriage on said frame, as the carriage moves therealong, said stabilizing means including a magnetic array extending between said first and second stations on said frame, and a diamagnetic plate mounted on said carriage, with at least a portion of the plate confronting and being disposed proximate to at least a portion of said array, as the carriage moves along said track, wherein magnetic interaction between said diamagnetic plate and the magnetic array acts to resist movement of the plate toward the array, and drive means for moving the carriage, with such in a levitated condition, along the frame between the first and second stations.

2. The apparatus of claim 1, wherein the frame-biasing magnet is an electromagnet or set or permanent magnets extending along the length of the frame, and the apparatus further includes voltage means for producing in the electromagnet, a magnetic force adapted to support the carriage and the object carried thereon.

3. The apparatus of claim 1, wherein the frame-biasing magnet is a permanent magnet or set of permanent magnets extending along the length of the frame magnetic force adapted to support the carriage and the object carried thereon.

4. The apparatus of claim 1, wherein said magnetic array includes a planar array composed of magnets arranged side-by-side in alternating polarity.

5. The apparatus of claim 1, wherein said magnetic array is a planar array composed of magnets arranged side-by-side in alternating vertical and horizontal magnetic pole orientation, with the vertically-oriented magnets afternating in polarity and the horizontally-oriented magnets afternating in polarity.

6. The apparatus of claim 1, wherein said magnetic array is formed of a plate of isotropic material that is magnetized with alternating poles.

7. The apparatus of claim 1, wherein said stabilizing means includes at least two space-apart magnetic arrays, and the diamagnetic plate has opposite faces, at least a portion of which confront and are proximate to at least a portion of the spaced apart magnetic arrays, wherein magnetic interaction between said diamagnetic plate and each planar array acts to maintain the plate between the adjacent arrays.

8. The apparatus of claim 7, wherein the magnetic array includes a plurality of spaced-apart planar arrays attached to an projecting from a base member, substantially normal thereto, and the diamagnetic plate includes a diamagnetic plate disposed between each pair of adjacent magnetic arrays.

9. The apparatus of claim 7, wherein the magnetic arrays and diamagnetic plates are planar and substantially horizontally disposed.

10. The apparatus of claim 7, wherein the magnetic arrays and diamagnetic plates are planar and substantially vertically disposed.

11. The apparatus of claim 1, wherein said diamagnetic plate composed of graphite or bismuth.

12. The apparatus of claim 1, which further includes a conductive plate carried on said carriage, for moving therewith proximate to and adjacent said magnetic array, as the carriage moves along said frame, to create eddy currents which resist movement of the carriage relative to poles of the magnetic arrays.

13. The apparatus of claim 1, wherein said frame biasing magnet includes a linear array of magnets separated from each other by a known spacing distance, and said magnetic drive means includes a conductive-wire path and an alternating current source connected to the wire path for producing a linear magnetic drive force on the linear array of biasing magnets.

14. The apparatus of claim 1, wherein said drive means operates by electrostatic attraction between electrostatic elements on the frame and carriage, as the carriage moves along the frame.

15. The apparatus of claim 1, wherein said drive means operates by a compressed gas stream applied to the carriage from said frame, as the carriage moves along the frame.

16. The apparatus of claim 1, wherein said frame and carriage are constructed to permit the carriage to be removed from the frame, at any point along the carriage travel, by moving the carriage laterally away from the frame.

* * * * *